(12) United States Patent
Fujisawa

(10) Patent No.: US 8,373,845 B2
(45) Date of Patent: Feb. 12, 2013

(54) EXPOSURE CONTROL APPARATUS, MANUFACTURING METHOD OF SEMICONDUCTOR DEVICE, AND EXPOSURE APPARATUS

(75) Inventor: Tadahito Fujisawa, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 427 days.

(21) Appl. No.: 12/832,600

(22) Filed: Jul. 8, 2010

(65) Prior Publication Data

US 2011/0043776 A1    Feb. 24, 2011

(30) Foreign Application Priority Data

Aug. 20, 2009    (JP) .................................. 2009-191259

(51) Int. Cl.
*G03B 27/52*    (2006.01)
*G03B 27/42*    (2006.01)
*G03B 27/68*    (2006.01)
*G03B 27/32*    (2006.01)

(52) U.S. Cl. ................. 355/55; 355/52; 355/53; 355/77

(58) Field of Classification Search .................... 355/52, 355/53, 55, 72–74, 77; 430/5, 8, 22, 30, 430/311, 312; 250/492.1, 492.2, 492.22, 250/548

See application file for complete search history.

(56) References Cited

U.S. PATENT DOCUMENTS

| | | | | |
|---|---|---|---|---|
| 5,412,214 A | * | 5/1995 | Suzuki et al. ................. | 250/548 |
| 5,811,211 A | * | 9/1998 | Tanaka et al. .................. | 430/30 |
| 5,990,540 A | * | 11/1999 | Yokoya .......................... | 257/620 |
| 6,090,510 A | * | 7/2000 | Tokuda ........................... | 430/30 |
| 6,118,515 A | * | 9/2000 | Wakamoto et al. ............. | 355/53 |
| 6,515,733 B1 | * | 2/2003 | Udo ................................ | 355/53 |
| 6,599,665 B1 | * | 7/2003 | Lin et al. ........................ | 430/5 |
| 7,474,386 B2 | | 1/2009 | Fujisawa et al. | |
| 2001/0019111 A1 | * | 9/2001 | Yamada et al. ................ | 250/548 |
| 2002/0039845 A1 | * | 4/2002 | Yoshimura .................... | 438/784 |
| 2003/0023402 A1 | * | 1/2003 | Kobayashi et al. ........... | 702/167 |
| 2003/0147059 A1 | * | 8/2003 | Tokuda et al. .................. | 355/53 |
| 2004/0257545 A1 | * | 12/2004 | Brinkhof et al. ................ | 355/53 |
| 2005/0110065 A1 | * | 5/2005 | Uchiyama et al. ............ | 257/296 |
| 2006/0094246 A1 | * | 5/2006 | Whitefield et al. ........... | 438/725 |
| 2009/0310112 A1 | * | 12/2009 | Kazaana ......................... | 355/67 |

FOREIGN PATENT DOCUMENTS

JP    08-037150    2/1996

\* cited by examiner

*Primary Examiner* — Toan Ton
*Assistant Examiner* — Christina Riddle
(74) *Attorney, Agent, or Firm* — Finnegan, Henderson, Farabow, Garrett & Dunner, L.L.P.

(57) ABSTRACT

According to one embodiment, an exposure control apparatus includes exposure setting unit that performs an exposure setting of setting an exposure shot as a shot that is exposed or a shot that is not exposed based on height information on a height of a substrate in the exposure shot arranged in a substrate peripheral portion, and an exposure instructing unit that outputs an exposure instruction to the shot that is exposed and an instruction to skip an exposure to the shot that is not exposed.

20 Claims, 11 Drawing Sheets

EXPOSURE CONTROL APPARATUS, MANUFACTURING METHOD OF SEMICONDUCTOR DEVICE, AND EXPOSURE APPARATUS

CROSS-REFERENCE TO RELATED APPLICATIONS

This application is based upon and claims the benefit of priority from the prior Japanese Patent Application No. 2009-191259, filed on Aug. 20, 2009; the entire contents of which are incorporated herein by reference.

FIELD

Embodiments described herein relate generally to an exposure control apparatus, a manufacturing method of a semiconductor device, and an exposure apparatus

BACKGROUND

In recent years, a device pattern size has been miniaturized, so that there is an increasing need to control a line width of a pattern formed on a substrate by a lithography process with high accuracy. Specially, in the lithography process for a memory or the like, it is needed to form a high-density line & space pattern under an optical condition close to a resolution limit of an exposure apparatus, so that a focus margin is small.

For example, a step & scan type projection exposure apparatus performs an exposure process on a wafer while performing a focus leveling correction. When the step & scan type projection exposure apparatus exposes, especially, a defective shot (imperfect shot in which a part in a shot is not formed as a product pattern) of a wafer peripheral portion, an effective focus boundary is set at a predetermined distance from the wafer peripheral portion. Then, height information on the wafer is obtained in a region on the inner side of the effective focus boundary, and a focus leveling control is performed by using this height information.

Because the wafer subjected to the actual process has a structure in which a plurality of films is laminated, a film thickness value is different depending on a process factor between a central portion and a peripheral portion of the wafer. Therefore, the effective focus boundary needs to be determined for each process of the exposure process.

However, the defective shot in the peripheral portion of the wafer becomes a shot (hereinafter, dummy shot) in which no device chip can be obtained from the defective shot in some cases. The dummy shot is preferably not exposed for improving throughput of the exposure apparatus; however, if there is no dummy shot, characteristics of an effective chip adjacent to the dummy shot are degraded in the process, such as a dry etching process or a CMP process, other than the lithography.

In a scanning exposure method described in Japanese Patent Application Laid-open No. H08-37150, auto focusing of the wafer is performed based on each focus position measured in a measurement region and a prefetch region on the front side of the measurement region in an exposure field. Then, when an absolute value of the difference between a prefetched focus position and a focus position in the measurement region exceeds an allowable value, prefetched data is ignored and the focus is controlled based on the focus position that is measured in advance at a central portion of the measurement region.

However, in the scanning exposure method described in Japanese Patent Application Laid-open No. H08-37150, when the peripheral portion of the wafer has a step that causes defocusing, a defect failure such as a pattern collapse occurs in some cases by the defocusing. Therefore, a problem arises in that exposure of the dummy shot lowers yield of a peripheral chip.

DETAILED DESCRIPTION

In general, according to one embodiment, an exposure control apparatus includes an exposure setting unit that performs an exposure setting of setting an exposure shot as a shot that is exposed or a shot that is not exposed based on height information on a height of a substrate in the exposure shot arranged in a substrate peripheral portion; and an exposure instructing unit that outputs an exposure instruction to the shot that is exposed and an instruction to skip an exposure to the shot that is not exposed.

Exemplary embodiments of an exposure control apparatus, a manufacturing method of a semiconductor device, and an exposure apparatus will be explained below in detail with reference to the accompanying drawings. The present invention is not limited to the following embodiments.

(First Embodiment)

Figure 1:
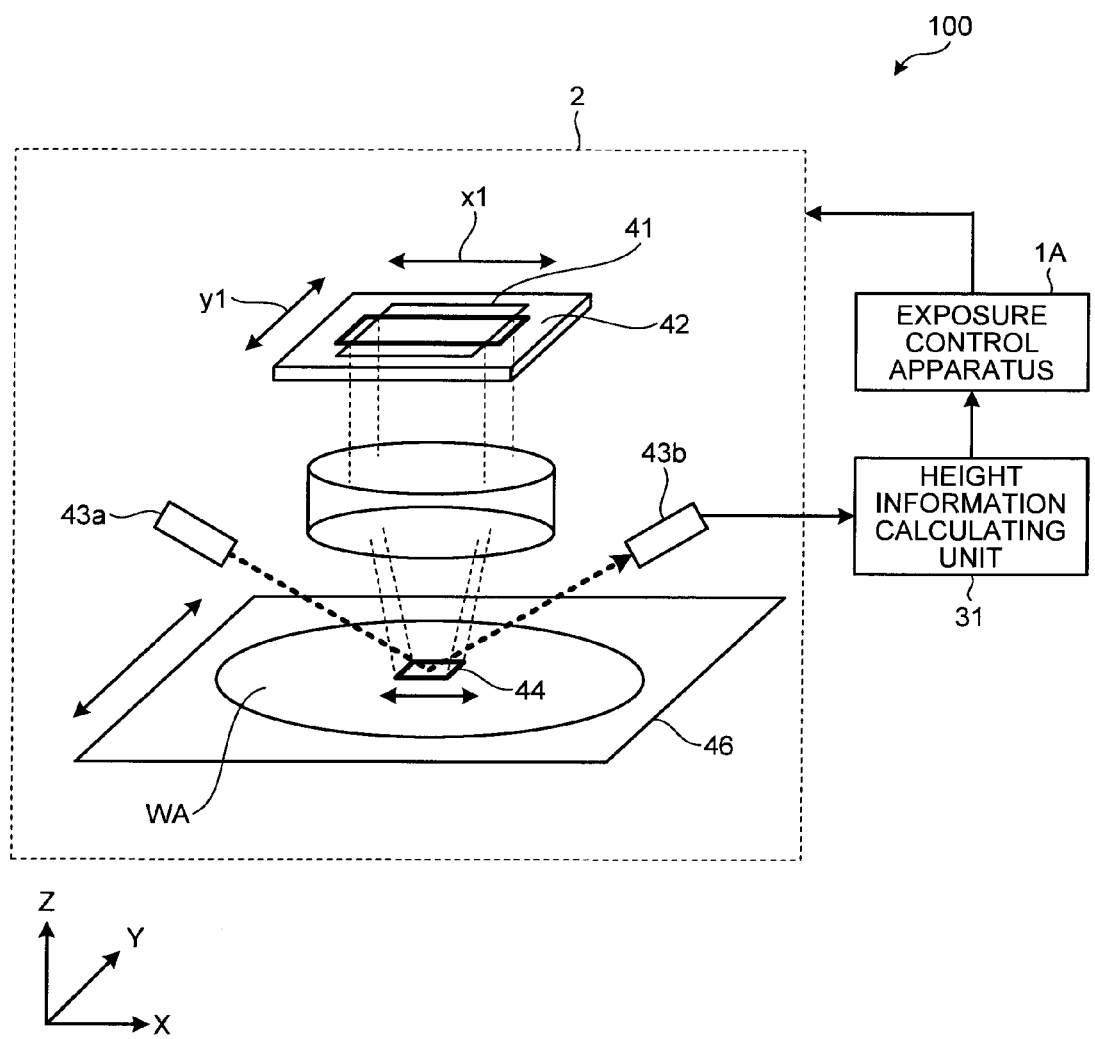
FIG. 1 is a diagram illustrating a configuration of an exposure apparatus according to a first embodiment.

FIG. 1 is a diagram illustrating a configuration of an exposure apparatus according to the first embodiment. An exposure apparatus 100 is an apparatus that determines whether to expose a dummy shot (dummy shot Rx to be described later) in which a device chip cannot be obtained from a defective shot in a peripheral portion of a wafer and performs an exposure process of the wafer (semiconductor substrate). The exposure apparatus 100 in the present embodiment determines whether to expose the dummy shot Rx based on an area on the inner side of a position of a WEE (Wafer Edge Exposure) or the like in a region in the dummy shot Rx.

The exposure apparatus 100 is a step & scan type projection exposure apparatus, and include an exposure mechanism 2, an exposure control apparatus 1A, and a height information calculating unit 31. The exposure mechanism 2 performs the exposure process of a wafer WA based on an instruction from the exposure control apparatus 1A.

The exposure mechanism 2 includes a reticle stage 42 which is provided with a slit in a slit direction x1 (X axis direction) and on which a reticle 41 is placed and a wafer stage 46 on which the wafer WA is placed. When the exposure mechanism 2 exposes the wafer WA, while the reticle 41 placed on the reticle stage 42 is moved in a scan direction y1 (Y axis direction) on the reticle stage 42, the wafer WA on the wafer stage 46 is moved together with the wafer stage 46 following the movement of the reticle 41.

Moreover, the exposure mechanism 2 includes height measuring units 43a and 43b that measure a height of an exposure surface 44. The height measuring unit 43a radiates light to the exposure surface 44 and the height measuring unit 43b detects reflected light from the exposure surface 44. The reflected light detected by the height measuring unit 43b is sent to the height information calculating unit 31 as the reflected light corresponding to the height of the exposure surface 44. The height information calculating unit 31 calculates wafer height information on a height of the wafer WA for each wafer WA based on a signal corresponding to the reflected light sent from the height measuring unit 43b.

The exposure control apparatus 1A is an apparatus, such as a computer, that determines whether to expose the dummy shot Rx by using information (such as exposure parameter, information on a chip, and information on a position of the WEE) input by a user or the like.

The exposure control apparatus 1A controls the exposure mechanism 2 based on a determination result of whether to expose the dummy shot Rx. Moreover, the exposure control apparatus 1A controls the wafer stage 46 based on the wafer height information, an exposure program, or the like.

The wafer stage 46 is connected to a not-shown Z-axis driving unit, and the Z-axis driving unit drives a position of the wafer stage 46 in a height direction (Z axis direction) to a predetermined position based on a control instruction from the exposure control apparatus 1A. The exposure apparatus 100 performs the exposure process while performing a focus correction or a leveling correction by a focus leveling function to realize transfer of a device pattern onto the wafer WA while satisfying a focus margin.

Figure 2:
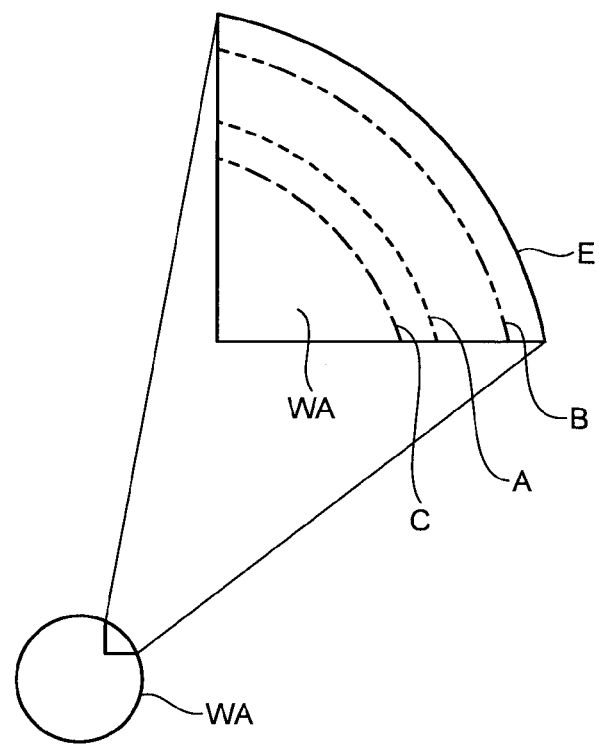
FIG. 2 is a diagram for explaining a position of a WEE.

Next, explanation is given for a position of the WEE that is used for determining whether to expose the dummy shot Rx. FIG. 2 is a diagram for explaining the position of the WEE. In the peripheral portion of the wafer WA, a position (edge bead removing position B) of removing an edge bead (Edge Bead Range), a position (WEE position A) of the WEE, and a position (dr position C) of an effective focus boundary (Disable Range) are arranged in a central direction from a wafer edge E in the order of the edge bead removing position B, the WEE position A, and the dr position C. The edge bead removing position B, the WEE position A, and the dr position C each represent a circle having a predetermined radius from the center position of the wafer WA.

The edge bead removing position (edge cut position) B is a boundary position between a region in which a resist is removed by a backside rinse using thinner or the like and a region in which the resist is not removed.

The WEE position A is a boundary position between a region in which the resist is removed from the upper surface side of the wafer WA by UV (ultraviolet) light or the like and a region (resist outermost peripheral portion) in which the resist is not removed. The WEE position A is, for example, set in a resist applying and developing apparatus.

The dr position C is a boundary position between a region (focus leveling correction region) in which the focus leveling correction is performed and a region in which the focus leveling correction is not performed.

Each of the edge bead removing position B, the WEE position A, and the dr position C is a position that is input to the exposure control apparatus 1A by a user. The edge bead removing position B and the WEE position A are positions that are determined by a process (backside rinse, thinner application on a wafer edge, and UV radiation) that is actually performed on the wafer WA and is accompanied by a wafer height change, and therefore potentially include information on the height of the wafer.

The dr position C is a position that is arbitrary set by a user based on yield, throughput, or the like. In FIG. 2, explanation is given for the case where the edge bead removing position B is positioned on the outer side of the WEE position A on the wafer WA; however, the positional relationship is not necessarily limited thereto.

The exposure control apparatus 1A in the present embodiment determines whether to expose the dummy shot Rx based on an area on the inner side of the WEE position A in the region of the dummy shot Rx. It is applicable that the determination of whether to expose the dummy shot Rx is performed based on an area on the inner side of the edge bead removing position B in the dummy shot Rx or an area on the inner side of the dr position C in the dummy shot Rx. In the followings, a case is explained in which it is determined whether to expose the dummy shot Rx based on the area on the inner side of the WEE position A in the dummy shot Rx.

Figure 3:
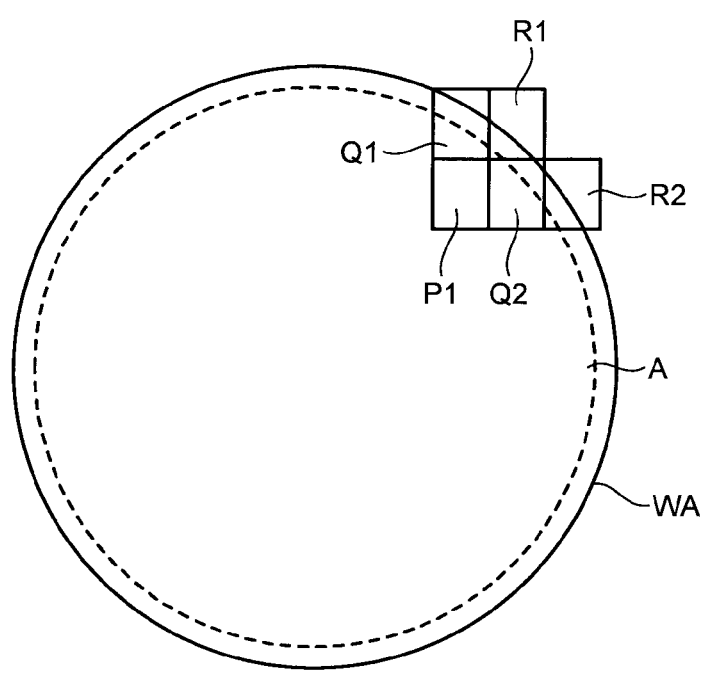
FIG. 3 is a diagram for explaining a dummy shot.

The dummy shot Rx is explained. FIG. 3 is a diagram for explaining the dummy shot. When the wafer WA is exposed, exposure shots are set on approximately the whole surface of the wafer WA in the exposure control apparatus 1A. In the exposure shot, one to a plurality of chips is arranged. Among these exposure shots, the exposure shot (exposure shot near the dr position C) arranged in the peripheral portion of the wafer WA partially protrudes on the outer side of the wafer WA in some cases. Therefore, not all chip patterns in the exposure shot arranged in the peripheral portion of the wafer WA can be transferred onto the wafer WA.

Among the exposure shots arranged in the peripheral portion of the wafer WA, the exposure shot that includes a region protruding from the wafer WA is the defective shot. The defective shot includes the exposure shot that includes an effective chip (chip in which a pattern for at least one chip can be formed as a product) and the exposure shot in which no chip can be formed. In FIG. 3, the exposure shot in which one or more effective chips can be formed is illustrated as effective defective shots Q1 and Q2, and the exposure shot in which no effective chip can be formed is illustrated as dummy shots R1 and R2.

Moreover, in FIG. 3, the exposure shot which is on the inner side of the effective defective shots Q1 and Q2 and the dummy shots R1 and R2 and in which all of the chips in the shot are the effective chips is illustrated as a perfect shot P1.

Figure 4A:
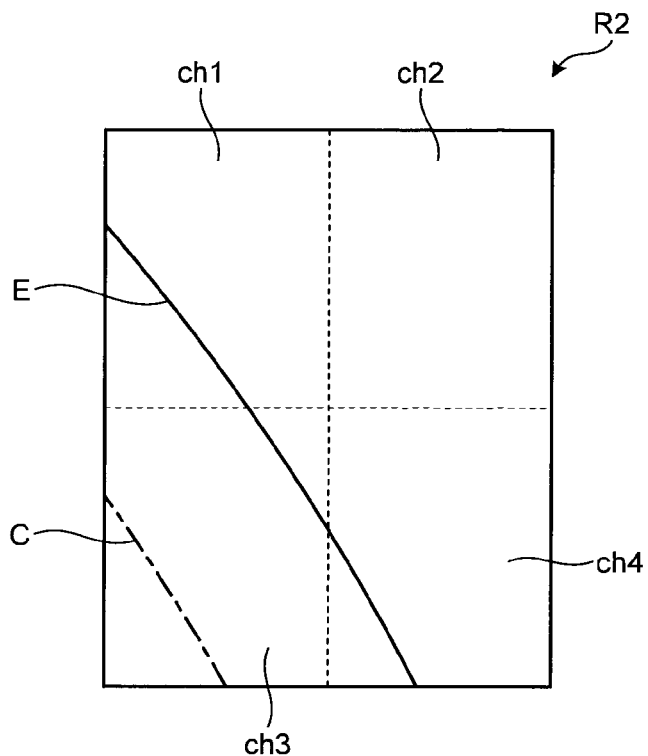
FIG. 4A is a diagram illustrating an example of the dummy shot.
Figure 4B:
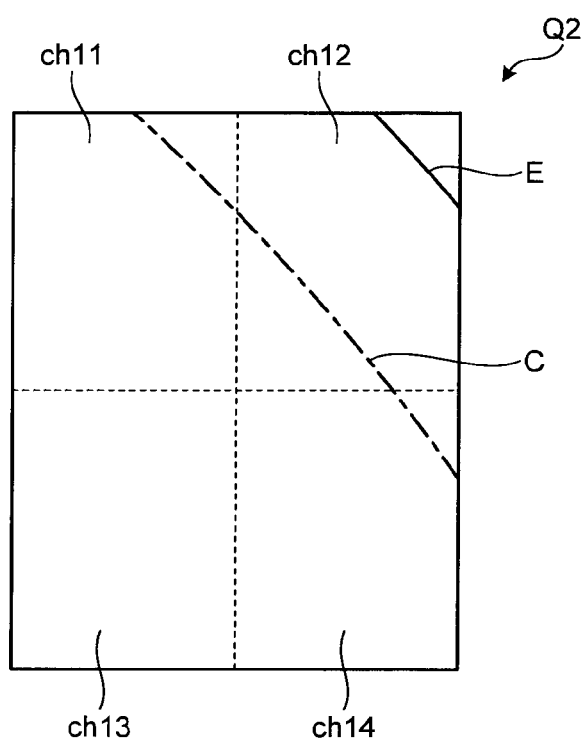
FIG. 4B is a diagram illustrating an example of an effective defective shot.

FIG. 4A is a diagram illustrating an example of the dummy shot, and FIG. 4B is a diagram illustrating an example of the effective defective shot. FIGS. 4A and 4B illustrate a case in which four product chips are arranged in one shot. FIG. 4A illustrates the dummy shot R2 as one example of the dummy shot Rx and FIG. 4B illustrates the effective defective shot Q2 as one example of an effective defective shot Qx.

In the dummy shot R2, product chips ch1 to ch4 are arranged as the product chips. If one product chip can be formed on the inner side of the dr position C, this product chip becomes the effective chip. When the wafer WA is exposed in the dummy shot R2 as shown in FIG. 4A, no product chip can be formed on the inner side of the dr position C, so that any of the product chips ch1 to ch4 does not become the effective chip.

In the effective defective shot Q2, product chips ch11 to ch14 are arranged as the product chips. When the wafer WA is exposed in the effective defective shot Q2 as shown in FIG. 4B, the product chip ch13 can be formed on the inner side of the dr position C, so that the product chip ch13 becomes the effective chip.

In the following explanation, the exposure shot in which one or more effective chips can be formed, such as the effective defective shots Q1 and Q2, is indicated as the effective defective shot Qx. The exposure shot in which no effective chip can be formed, such as the dummy shots R1 and R2, is indicated as the dummy shot Rx. Moreover, the exposure shot in which all of the product chips in the exposure shot become the effective shots, such as the perfect shot P1, is indicated as a perfect shot Px.

In the perfect shot Px or the effective defective shot Qx, the effective chip is formed on the wafer WA, so that all of the shots are exposure targets. Because the effective chip cannot be formed in the dummy shot Rx, the dummy shot Rx is preferably not exposed for improving the throughput of the exposure apparatus 100. Moreover, the dummy shot Rx is affected by the defocusing due to a tilt (step) of the film thickness of the peripheral portion of the wafer WA. Therefore, when the dummy shot Rx is exposed on the wafer WA, a focus failure occurs and thus peeling or collapse of a pattern may occur.

On the other hand, if the dummy shot Rx is not exposed, characteristics of the effective chip adjacent to the dummy shot Rx are degraded in the process, such as a dry etching process or a CMP (Chemical Mechanical Polishing) process, other than lithography. For this reason, if the dummy shot Rx is not exposed, a defect occurs in the effective chip, so that the yield is lowered.

Thus, it is desired to determine whether to expose the dummy shot Rx while taking into account a process capability such as the dry etching process or the CMP process, throughput loss of the exposure apparatus 100, and the like.

Therefore, the exposure control apparatus 1A in the present embodiment determines whether to expose each dummy shot Rx to suppress yield lowering of the peripheral portion of the wafer WA due to the defocusing of the dummy shot Rx. For this purpose, the WEE position A indicating a resist outermost peripheral region in which a resist pattern remains after development is input to the exposure control apparatus 1A in addition to the dr position C indicating the focus leveling correction region as input parameters.

Figure 5:
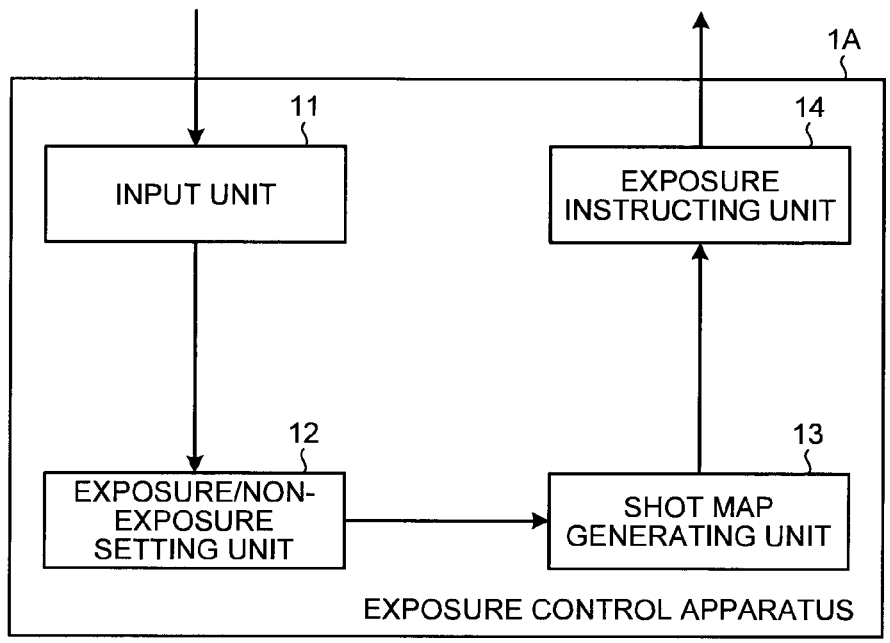
FIG. 5 is a block diagram illustrating a configuration of the exposure control apparatus according to the first embodiment.

FIG. 5 is a block diagram illustrating a configuration of the exposure control apparatus according to the first embodiment. The exposure control apparatus 1A includes an input unit 11, an exposure/non-exposure setting unit (exposure setting unit) 12, a shot map generating unit 13, and an exposure instructing unit 14.

The input unit 11 inputs the exposure parameter, the chip information, the WEE position A that is information indicating a WEE width (resist removing region width), an exposure reference of the dummy shot Rx, and the like. The chip information is information on the product chip such as a position of each exposure shot set on the wafer WA, a chip size of the product chip arranged in the exposure shot, a chip array, and a chip layout. The exposure reference of the dummy shot Rx is a determination reference on whether to expose the dummy shot Rx and whether to skip the exposure. The exposure reference of the dummy shot Rx is, for example, information (threshold) on an area of a portion positioned on the inner side of the WEE position A in the dummy shot Rx. The input unit 11 sends the chip information, the WEE position A, the exposure reference of the dummy shot Rx, and the like to the exposure/non-exposure setting unit 12.

The exposure/non-exposure setting unit 12 determines whether to expose the dummy shot Rx by using the input information input to the input unit 11, such as the chip information, the WEE position A, and the exposure reference of the dummy shot Rx, and sets exposure or non-exposure (with exposure or without exposure) to the dummy shot Rx based on a determination result. The exposure/non-exposure setting unit 12 sends the exposure or non-exposure set to the dummy shot Rx to the shot map generating unit 13.

The shot map generating unit 13 generates the shot map (exposure map) on the surface of the wafer WA by using the exposure or non-exposure set to the dummy shot Rx. The shot map is a map in which the exposure shot is set on the wafer WA and is information in which the position (coordinates) of the exposure shot that is exposed, a size of the exposure shot, an exposure order, and the like are set. In the present embodiment, only the exposure shot that is set to be exposed by the exposure/non-exposure setting unit 12 among the dummy shots Rx is set on the shot map. The shot map generating unit 13 sends the generated shot map to the exposure instructing unit 14.

The exposure instructing unit 14 sends an exposure instruction of the wafer WA to the exposure mechanism 2 based on the shot map generated by the shot map generating unit 13. The exposure instructing unit 14 sends the exposure instruction to the exposure mechanism 2 so that only the exposure shot (dummy shot Rx on the shot map) that is set to be exposed by the exposure/non-exposure setting unit 12 among the dummy shots Rx, the perfect shot Px, and the effective defective shot Qx are exposed.

Figure 6:
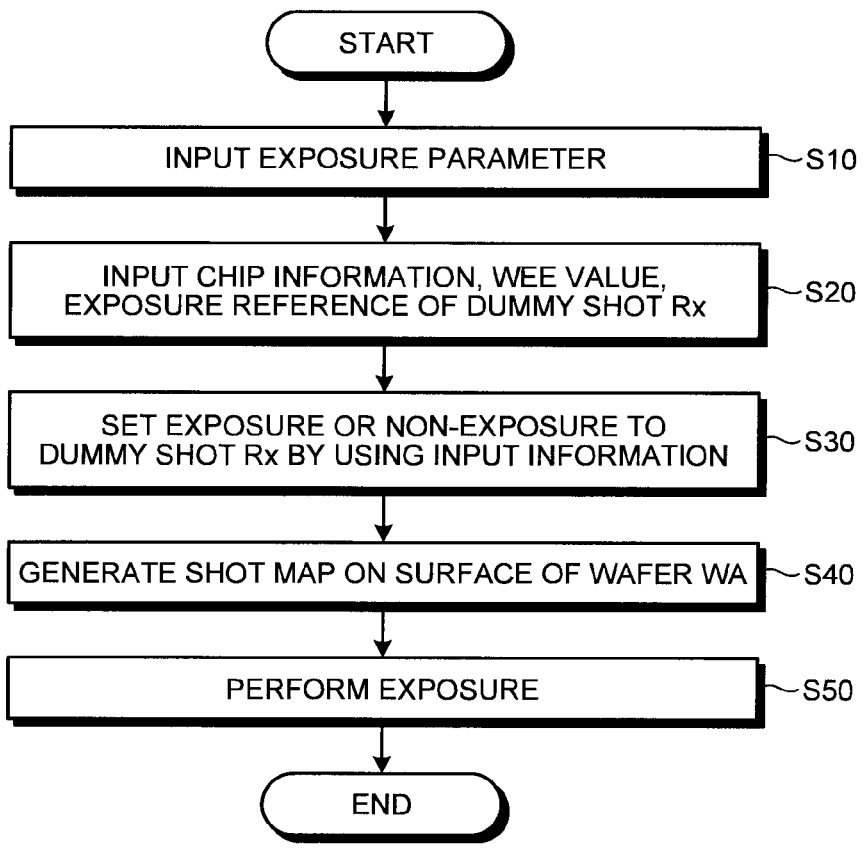
FIG. 6 is a flowchart illustrating an operation procedure of the exposure control apparatus according to the first embodiment.

Next, an operation procedure of the exposure control apparatus 1A according to the first embodiment is explained. FIG. 6 is a flowchart illustrating the operation procedure of the exposure control apparatus according to the first embodiment. The exposure parameter, the chip information, the WEE position A, the exposure reference of the dummy shot Rx, and the like are input to the input unit 11 (Steps S10 and S20). The input unit 11 sends the chip information, the WEE position A, the exposure reference of the dummy shot Rx, and the like to the exposure/non-exposure setting unit 12.

The exposure/non-exposure setting unit 12 determines whether to expose the dummy shot Rx by using the chip information, the WEE position A, the exposure reference of the dummy shot Rx, and the like, and sets the exposure or non-exposure to the dummy shot Rx based on the determination result (Step S30). Specifically, the exposure/non-exposure setting unit 12 extracts the defective shot among the exposure shots based on the chip size and the chip array in the shot. Then, the exposure/non-exposure setting unit 12 determines whether each defective shot includes the effective chip. The exposure/non-exposure setting unit 12 sets the defective shot that does not include the effective chip as the dummy shot Rx among the defective shots. Moreover, the exposure/non-exposure setting unit 12 sets the defective shot that includes the effective chip as the effective defective shot Qx among the defective shots.

Figure 7:
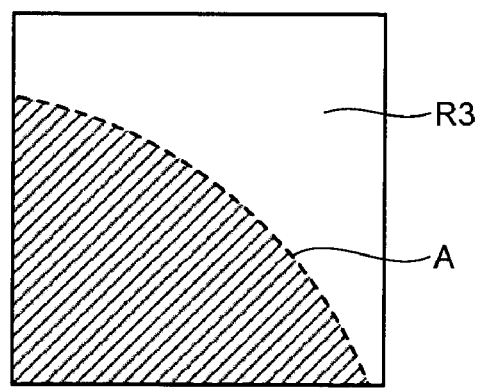
FIG. 7 is a diagram illustrating an example of a portion positioned on the inner side of a WEE position in the dummy shot.

A setting method of the exposure or non-exposure to the dummy shot Rx is explained. When the dummy shot Rx is not exposed, the effect on the product chip arranged near the dummy shot Rx becomes large as an area of a portion positioned on the inner side of the WEE position A in the dummy shot Rx is large. Therefore, the exposure/non-exposure setting unit 12, for example, sets to expose the dummy shot Rx when the area of the portion positioned on the inner side of the WEE position A in the dummy shot Rx is larger than a predetermined value, and sets not to expose the dummy shot Rx when the area of the portion positioned on the inner side of the WEE position A in the dummy shot Rx is equal to or smaller than the predetermined value. FIG. 7 is a diagram illustrating an example of the portion positioned on the inner side of the WEE position in the dummy shot. In FIG. 7, the portion positioned on the inner side of the WEE position A in a dummy shot R3 is indicated by diagonal lines.

Preferably, the dummy shot Rx is not exposed in view of the throughput of the exposure apparatus 100. However, in order to form the product chip to be a quality product near the peripheral portion of the wafer WA, when the degree of completion of the process such as the dry etching process and the CMP process is low or in the period in which the process capability is low, the yield of the peripheral chip is not improved unless the dummy shot Rx is provided. On the other hand, after the degree of completion of the process is improved and the process capability is improved, the yield of the product chip arranged near the peripheral portion of the wafer WA increases even if the dummy shot Rx is not exposed.

Therefore, it is applicable that the exposure/non-exposure setting unit 12 in the present embodiment sets the exposure or non-exposure to the dummy shot Rx based on a failure rate of the product chips (hereinafter, dummy-shot adjacent chips) adjacent to the dummy shot Rx. Moreover, it is applicable that the exposure/non-exposure setting unit 12 sets the exposure or non-exposure to the dummy shot Rx based on an area ratio (hereinafter, in-WEE area ratio) of an area of the portion positioned on the inner side of the WEE position A in the dummy shot Rx to an area of the product chip. The in-WEE area ratio is a value obtained by dividing the area of the portion positioned on the inner side of the WEE position A in the dummy shot Rx by the area of the product chip. The in-WEE area ratio is information on a region that affects the dummy-shot adjacent chip in the dry etching process or the CMP process and is a ratio of, for example, an area of a portion in which a pattern remains after the development to the area of the product chip.

Figure 8:
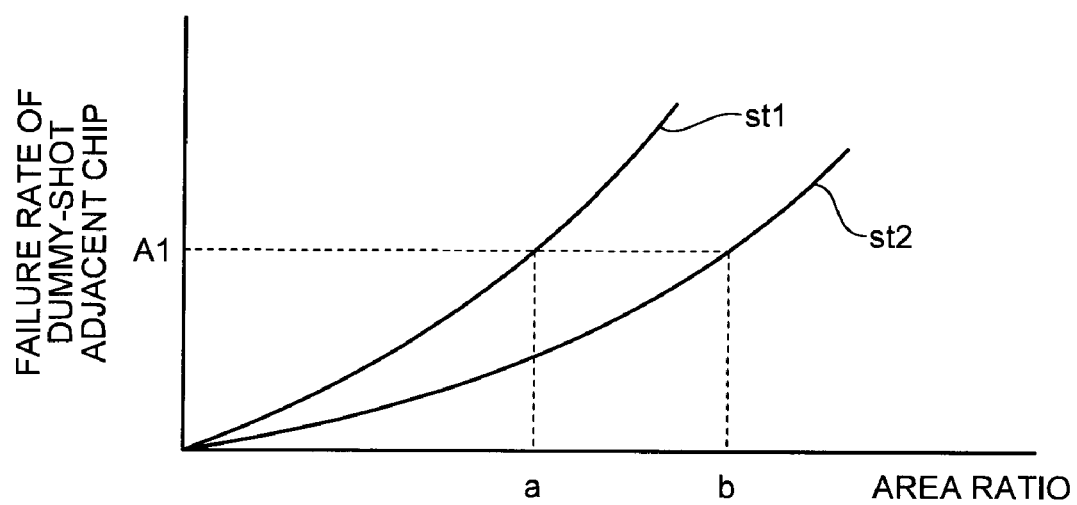
FIG. 8 is a diagram for explaining a relationship between a failure rate of a dummy-shot chip and an in-WEE area ratio.

FIG. 8 is a diagram for explaining a relationship between the failure rate of the dummy-shot adjacent chip and the in-WEE area ratio. In FIG. 8, a horizontal axis indicates the in-WEE area ratio and a vertical axis indicates the failure rate of the dummy-shot adjacent chip. Failure rate curves st1 and st2 are curves indicating the failure rate when the dummy shot Rx is not exposed.

The failure rate curve st1 indicates a relationship between the in-WEE area ratio and the failure rate of the dummy-shot adjacent chip at an initial production stage, and the failure rate curve st2 indicates a relationship between the in-WEE area ratio and the failure rate of the dummy-shot adjacent chip at a process completion stage. As shown in the failure rate curves st1 and st2 induced for each degree of completion of the process, the failure rate of the dummy-shot adjacent chip increases as the in-WEE area ratio increases.

At the initial production stage of the wafer WA, the degree of completion of the process is low, so that the failure rate of the dummy-shot adjacent chip is high. Therefore, at the initial production stage, the WEE position A is set inside on the wafer WA compared with the process completion stage. When the WEE position A is set to the inside on the wafer WA, the in-WEE area ratio becomes small. However, even when the in-WEE area ratio is small, the failure rate of the dummy-shot adjacent chip is high when the dummy shot Rx is not exposed at the initial production stage. Therefore, at the initial production stage, even when the in-WEE area ratio is small, the dummy shot Rx needs to be set as the exposure shot. For example, for satisfying a failure rate A1 of the dummy-shot adjacent chip, only the dummy shot Rx whose in-WEE area ratio is "a" or lower can be excluded from an exposure target at the time of the initial production stage.

On the other hand, as the degree of completion of the process increases, the state changes so that a quality chip can be formed even if the WEE position A is set to the side of the peripheral portion of the wafer WA compared with the initial production stage. When the WEE position A is set to the side of the peripheral portion of the wafer WA, the in-WEE area ratio becomes large. Even if the in-WEE area ratio is large, the failure rate of the dummy-shot adjacent chip when the dummy shot Rx is not exposed is low at the process completion stage. Therefore, at the process completion stage, even when the in-WEE area ratio is large, the dummy shot Rx does not need to be set as the exposure shot. For example, as shown in the failure rate curve st2, at the process completion stage, when the in-WEE area ratio is "b" that is larger than "a" at the initial production stage, the failure rate A1 of the dummy-shot adjacent chip can be satisfied.

This indicates that even if the determination reference of the exposure or non-exposure to the dummy shot Rx is set to the large in-WEE area ratio (even if the number of the dummy shots Rx is reduced), the state changes so that a quality chip can be obtained. Therefore, if the defective shot whose in-WEE area ratio exceeds "a" is set as the exposure shot, the number of the dummy shots Rx to be exposed increases, which leads to the throughput loss of the exposure apparatus 100, thereby significantly reducing the production efficiency. On the other hand, if the defective shot whose in-WEE area ratio exceeds "b" is set as the exposure shot, the number of the dummy shots Rx to be exposed decreases, so that the throughput of the exposure apparatus 100 is improved.

When the exposure or non-exposure to the dummy shot Rx is set based on the failure rate of the dummy-shot adjacent chip, the in-WEE area ratio, the failure rate curves st1 and st2, and the like are input to the input unit 11. Whereby, the exposure apparatus 100 can perform the exposure setting to the dummy shot Rx in accordance with the failure rate of the dummy-shot adjacent chip.

The wafer WA is, for example, manufactured by the same process for devices of the same generation. Many derivatives exist in the device, and even the device of the same generation has a different shot layout for each derivative. In the present embodiment, the number of the dummy shots Rx to be the exposure target is flexibly reduced in accordance with the degree of completion of the process and the failure rate of the dummy-shot adjacent chip.

After setting the exposure or non-exposure to the dummy shot Rx, the exposure/non-exposure setting unit 12 sends the information on the exposure or non-exposure set to the dummy shot Rx, the chip information, and the like to the shot map generating unit 13. The shot map generating unit 13 generates the shot map on the surface of the wafer WA by using the exposure or non-exposure set to the dummy shot Rx, the chip information, and the like (Step S40). The shot map generating unit 13 sets the perfect shot Px and the effective defective shot Qx as the exposure target shot and sets the dummy shot Rx, which is set to be exposed, as the exposure target shot on the shot map. The shot map generating unit 13 sends the generated shot map to the exposure instructing unit 14.

The exposure instructing unit 14 sends the exposure instruction to the wafer WA to the exposure mechanism 2 based on the shot map generated by the shot map generating unit 13. The exposure instructing unit 14 sends the exposure instruction to the exposure mechanism 2 so that all of the perfect shots Px and all of the effective defective shots Qx are exposed.

Moreover, the exposure instructing unit 14 sends the exposure instruction to the exposure mechanism 2 so that only the exposure shot, which is set to be exposed by the exposure/non-exposure setting unit 12 among the dummy shots Rx, is exposed and the exposure shot, which is set not to be exposed by the exposure/non-exposure setting unit 12 among the dummy shots Rx, is skipped. Whereby, the exposure mechanism 2 performs the exposure on the wafer WA in accordance with the instruction from the exposure instructing unit 14 (Step S50). The exposure mechanism 2 exposes all of the perfect shots Px and all of the effective defective shots Qx. Moreover, the exposure mechanism 2 exposes only the exposure shot that is set to be exposed by the exposure/non-exposure setting unit 12 among the dummy shots Rx.

Because the process is improved day by day, the degree of completion of the process increases from day to day. Thus, it is applicable that the exposure apparatus 100 and APC system interact with each other, and a value of the determination reference (exposure reference of the dummy shot Rx) of the exposure or non-exposure to the dummy shot Rx is determined while taking into account the changing capability of the process. Whereby, it is possible to always set the dummy shot Rx to be the exposure target efficiently and expose the wafer WA.

The setting of the exposure or non-exposure to the dummy shot Rx is, for example, performed for each layer of a wafer process. The wafer WA exposed in the exposure apparatus 100 is thereafter subjected to a development process, an etching process, and the like of the wafer. Specifically, for example, a mask material, which is a process target of the wafer WA, is processed with a resist pattern formed on the wafer WA by the transfer in the lithography process as a mask and further a process target film of the wafer WA is etched to be patterned by using the patterned mask material. When manufacturing a semiconductor device (such as semiconductor element and liquid crystal display device), the setting of the exposure or non-exposure to the dummy shot Rx, the exposure process, the development process, the etching process, and the like are repeated for each layer.

In this manner, the exposure or non-exposure to the dummy shot Rx is set based on the WEE position A of the wafer WA that is set in the resist applying and developing apparatus, the chip layout in the exposure shot, and the like, so that the exposure or non-exposure to the dummy shot Rx can be flexibly set.

Moreover, the exposure or non-exposure to the dummy shot Rx on which the exposure is preferably not performed for improving the throughput of the exposure apparatus 100 is set based on the failure rate of the dummy-shot adjacent chip, the process capability of the dry etching process or the CMP process after the lithography process, the throughput loss of the exposure apparatus 100, and the like, so that the exposure or non-exposure to the dummy shot Rx can be flexibly set.

Therefore, the shot map on the surface of the wafer WA can be flexibly generated, and consequently, the wafer WA can be exposed with high throughput while lowering the failure rate of the dummy-shot adjacent chip.

In the present embodiment, the in-WEE area ratio is calculated by using the area ratio with respect to the product chip; however, the in-WEE area ratio can be calculated by using the area ratio with respect to the exposure shot. In this case, the in-WEE area ratio is an area ratio of the area of the portion positioned on the inner side of the WEE position A in the dummy shot Rx to an area of the exposure shot. In the present embodiment, a case is explained in which the exposure apparatus 100 includes the height information calculating unit 31; however, it is applicable that the exposure apparatus 100 does not include the height information calculating unit 31.

Moreover, for example, when the wafer WA is exposed using a negative resist, the exposure or non-exposure to the dummy shot Rx cannot be set even if the WEE position A is used. Therefore, in such a case, for example, the exposure or non-exposure to the dummy shot Rx can be set by using the edge bead removing position B.

Furthermore, in the present embodiment, the exposure or non-exposure to the dummy shot Rx is set based on the failure rate of the dummy-shot adjacent chip; however, when a plurality of the exposure apparatuses 100 is used, the exposure or non-exposure to the dummy shot Rx can be set for each of the exposure apparatuses 100. In this case, the exposure or non-exposure to the dummy shot Rx is set so that the exposure to the dummy shot Rx is not performed for the exposure apparatus 100 whose failure rate increases when the dummy shot Rx is exposed.

Moreover, in the present embodiment, the exposure or non-exposure to the dummy shot Rx is determined by using the in-WEE area ratio; however, any index can be used for the determination of the exposure or non-exposure to the dummy shot Rx so long as the index has a correlation with an area of a region between the dr position C and the WEE position A in the dummy shot Rx.

In this manner, according to the first embodiment, because the exposure or non-exposure to the dummy shot Rx is set by using the WEE position A, the dummy-shot adjacent chip arranged in the peripheral portion of the wafer WA can be formed with high yield and the wafer WA as a whole can be exposed with high throughput.

(Second Embodiment)

Next, the second embodiment is explained with reference to FIG. 9 to FIG. 16. In the second embodiment, the exposure or non-exposure to the dummy shot Rx is determined by using the focus leveling value measured on the inner side of the WEE position A among the focus leveling values in the dummy shot Rx.

Figure 9:
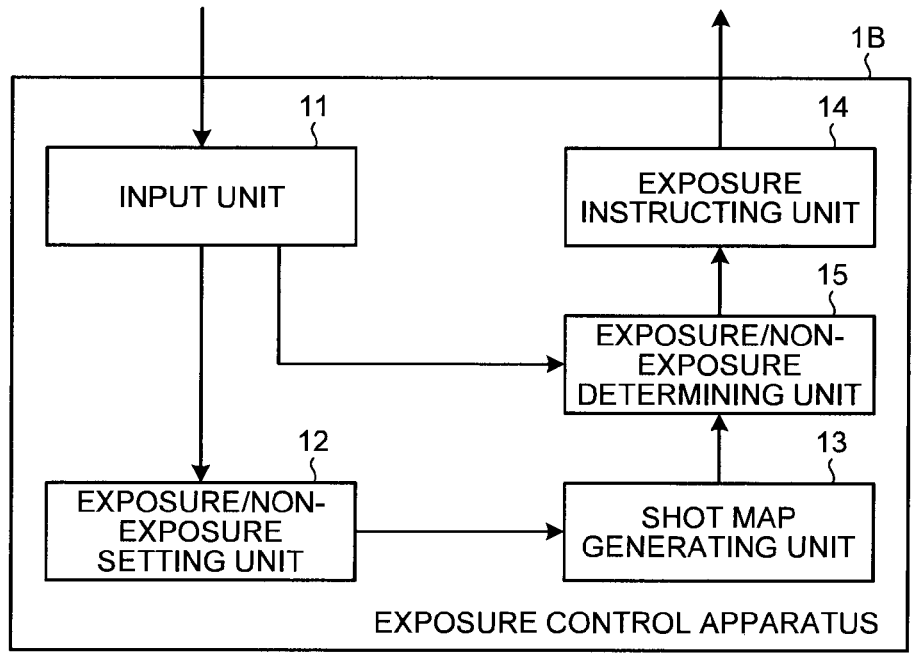
FIG. 9 is a block diagram illustrating a configuration of an exposure control apparatus according to a second embodiment.

FIG. 9 is a block diagram illustrating a configuration of an exposure control apparatus according to the second embodiment. In each component shown in FIG. 9, components that achieve the same function as the exposure control apparatus 1A in the first embodiment shown in FIG. 5 are given the same reference numerals and redundant explanation is omitted. The exposure apparatus 100 in the present embodiment is different from the exposure apparatus 100 shown in FIG. 1 in that an exposure control apparatus 1B is provided instead of the exposure control apparatus 1A.

The exposure control apparatus 1B includes an exposure/non-exposure determining unit 15 in addition to the input unit 11, the exposure/non-exposure setting unit 12, the shot map generating unit 13, and the exposure instructing unit 14. The exposure/non-exposure determining unit 15 has an exposure setting function together with the exposure/non-exposure setting unit 12, and sets the dummy shot Rx on which the exposure is actually performed and the dummy shot Rx on which the exposure is not actually performed among the dummy shots Rx (dummy shots Rx as the exposure target) that are set in the shot map. The exposure/non-exposure determining unit 15 determines whether to actually expose each of the dummy shots Rx by using the focus leveling value measured on the inner side of the WEE position A and the focus leveling value measured on the inner side of the dr position C in the dummy shot Rx, among the focus leveling values in the dummy shot Rx.

Figure 10:
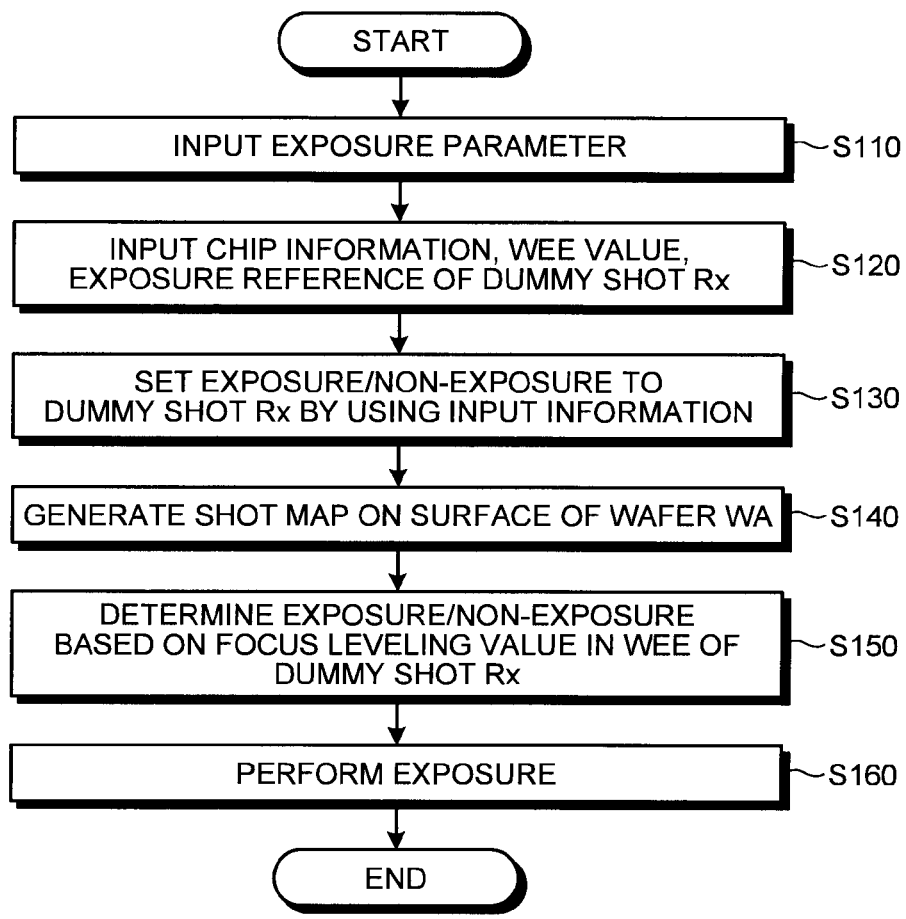
FIG. 10 is a flowchart illustrating an operation procedure of the exposure control apparatus according to the second embodiment.

Next, an operation procedure of the exposure control apparatus 1B according to the second embodiment is explained. FIG. 10 is a flowchart illustrating the operation procedure of the exposure control apparatus according to the second embodiment. Explanation is omitted for the process in which the operation similar to the operation procedure of the exposure control apparatus 1A according to the first embodiment shown in FIG. 6 is performed.

The exposure parameter, the chip information, the WEE position A, the exposure reference of the dummy shot Rx, and the like are input to the input unit 11 of the exposure control apparatus 1B in the similar manner to the exposure control apparatus 1A. Moreover, the focus leveling value in the dummy shot Rx is input to the input unit 11. The focus leveling value is wafer height information calculated by the height information calculating unit 31. The focus leveling value is sent to the input unit 11 from the height information calculating unit 31 (Steps S110 and S120).

The input unit 11 sends the chip information, the WEE position A, the exposure reference of the dummy shot Rx, and the like to the exposure/non-exposure setting unit 12. Moreover, the input unit 11 sends the focus leveling value to the exposure/non-exposure determining unit 15.

The exposure/non-exposure setting unit 12 determines whether to expose the dummy shot Rx by using the chip information, the WEE position A, the exposure reference of the dummy shot Rx, and the like, and sets the exposure or non-exposure to the dummy shot Rx based on the determination result (Step S130).

The shot map generating unit 13 generates the shot map on the surface of the wafer WA by using the exposure or non-exposure set to the dummy shot Rx (Step S140). The shot map generating unit 13 sends the generated shot map to the exposure/non-exposure determining unit 15.

The exposure/non-exposure determining unit 15 extracts the dummy shot Rx set in the shot map. Moreover, the exposure/non-exposure determining unit 15 extracts the focus leveling value on the inner side of the WEE position A among the focus leveling values in the dummy shot Rx and the focus leveling value on the inner side of the dr position C among the focus leveling values in the dummy shot Rx, for each dummy shot Rx.

The exposure/non-exposure determining unit 15 determines whether to actually expose the dummy shot Rx for each dummy shot Rx among the extracted dummy shots Rx based on the focus leveling value on the inner side of the WEE position A and the focus leveling value on the inner side of the dr position C in the dummy shot Rx (Step S150).

Specifically, the exposure/non-exposure determining unit 15 calculates a tendency of the leveling (coefficient) in the X direction when the dummy shot Rx is scanned and a tendency of the leveling (coefficient) in the Y direction when the dummy shot Rx is scanned, as the focus leveling value on the inner side of the WEE position A in the dummy shot Rx. Moreover, the exposure/non-exposure determining unit 15 calculates the tendency of the leveling (coefficient) in the X direction when the dummy shot Rx is scanned and the tendency of the leveling (coefficient) in the Y direction when the dummy shot Rx is scanned, as the focus leveling value on the inner side of the dr position C in the dummy shot Rx. Then, the exposure/non-exposure determining unit 15 determines whether to actually expose the dummy shot Rx by using the tendency of the focus leveling value on the inner side of the WEE position A and the tendency of the focus leveling value on the inner side of the dr position C.

Figure 11:
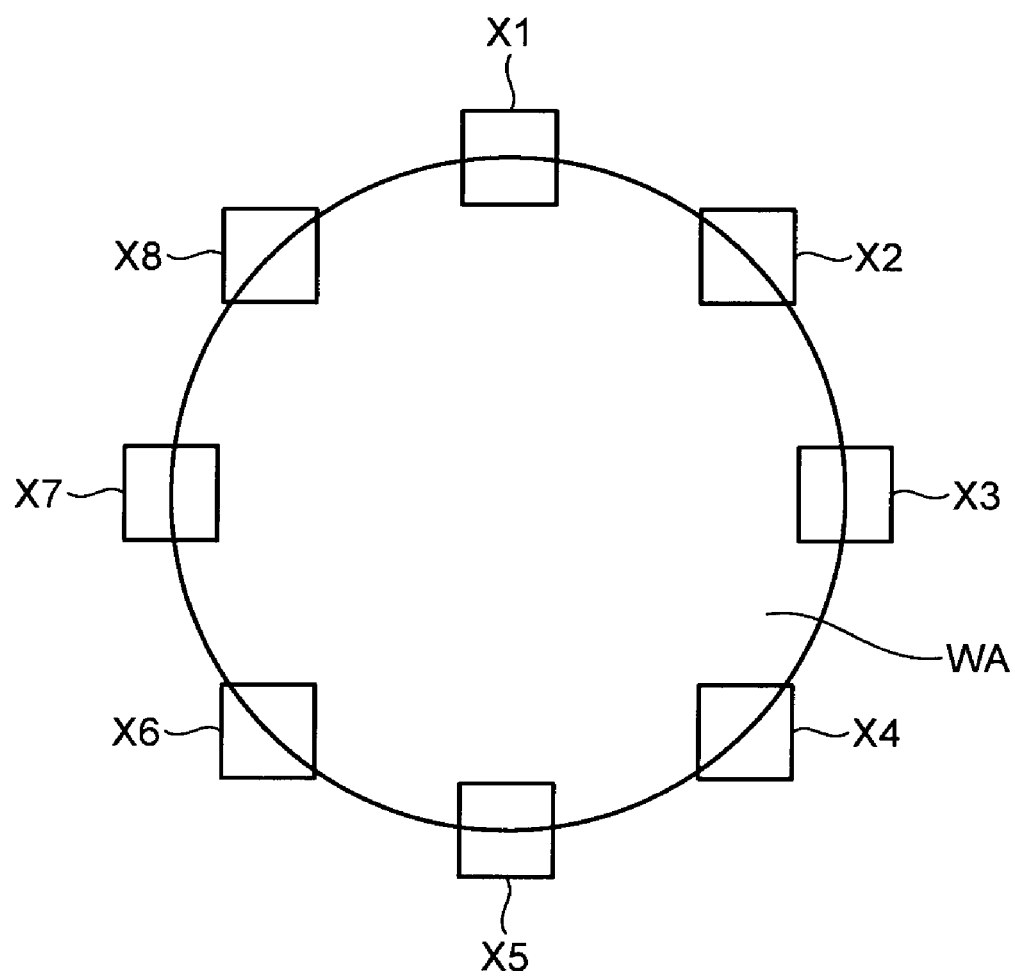
FIG. 11 is a diagram for explaining a tendency calculating position of a focus leveling value that is set on a wafer surface.

The exposure/non-exposure determining unit 15 calculates the tendency of the focus leveling value for each position on the surface of the wafer WA in advance, and determines whether to actually expose the dummy shot Rx for each position on the surface of the wafer WA. FIG. 11 is a diagram for explaining a tendency calculating position of the focus leveling value that is set on the wafer surface. For example, the tendency calculating positions of the focus leveling value are set as regions X1 to X8 in the peripheral portion of the wafer WA. The exposure/non-exposure determining unit 15 calculates the tendency of the focus leveling value for each of the regions X1 to X8 in advance, and determines whether to actually expose the dummy shot Rx for each of the regions X1 to X8.

Figure 12A:
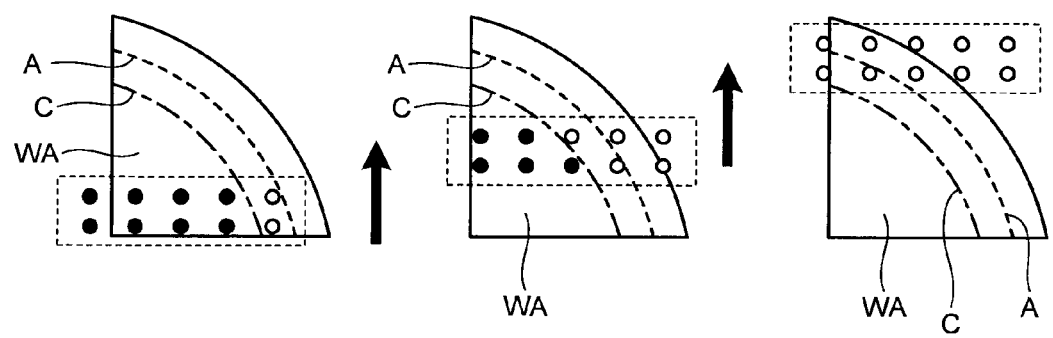
FIG. 12A is a diagram for explaining a conventional focus leveling control method.
Figure 12B:
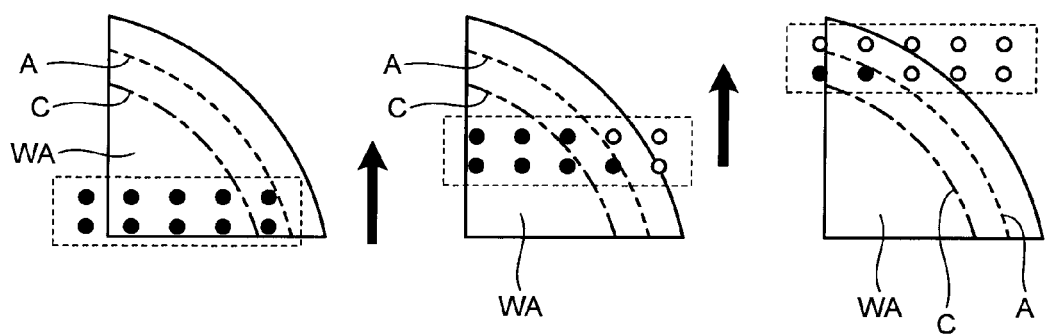
FIG. 12B is a diagram for explaining a focus leveling control method in a present embodiment.

FIGS. 12A and 12B are diagrams for explaining a difference between a conventional focus leveling control method and a focus leveling control method in the present embodiment. FIG. 12A illustrates the conventional focus leveling control method and FIG. 12B illustrates the focus leveling control method in the present embodiment. Among circles illustrated in FIGS. 12A and 12B, a closed circle indicates a position at which the focus leveling value is detected and an open circle indicates a position at which the focus leveling value is not detected. In the conventional focus leveling control method, the focus leveling control is performed in a region on the inner side of the dr position C and the focus leveling control is not performed in a region on the outer side of the dr position C.

On the other hand, in the focus leveling control method in the present embodiment, the focus leveling control is performed in a region on the inner side of the WEE position A and the focus leveling control is not performed in a region on the outer side of the WEE position A. In the present embodiment, the focus leveling control including the wafer height information on the outer side of the dr position C can be performed by performing the focus leveling control in the region on the inner side of the WEE position A.

Next, a determination method of the exposure or non-exposure to the dummy shot Rx by the exposure/non-exposure determining unit 15 is explained. The exposure/non-exposure determining unit 15 in the present embodiment determines the exposure or non-exposure to the dummy shot Rx based on the tendency of the focus leveling value and the yield of the dummy-shot adjacent chip.

Figure 13A:
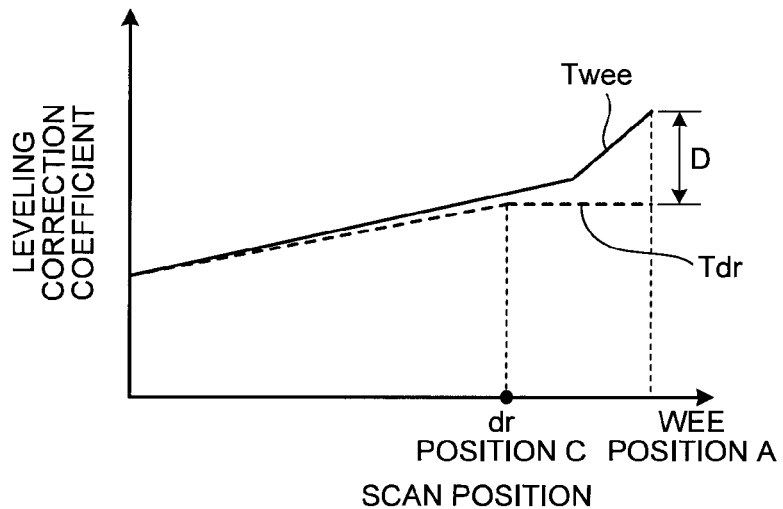
FIGS. 13A to 13C are diagrams for explaining a determination method of exposure or non-exposure to the dummy shot based on a tendency of the focus leveling value and yield of the dummy-shot adjacent chip.
Figure 13B:
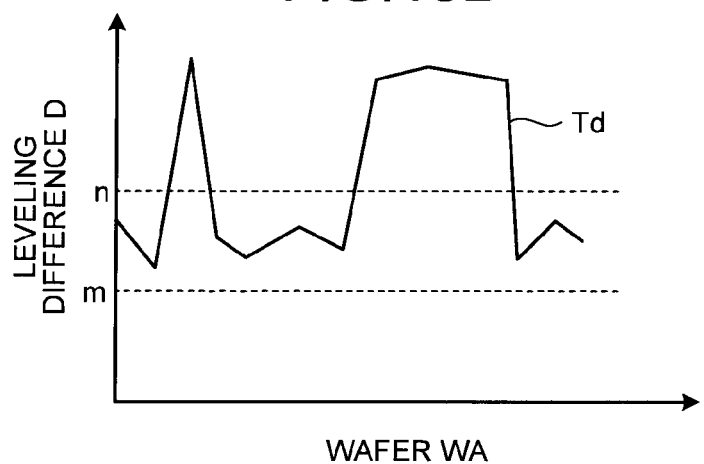
Figure 13C:
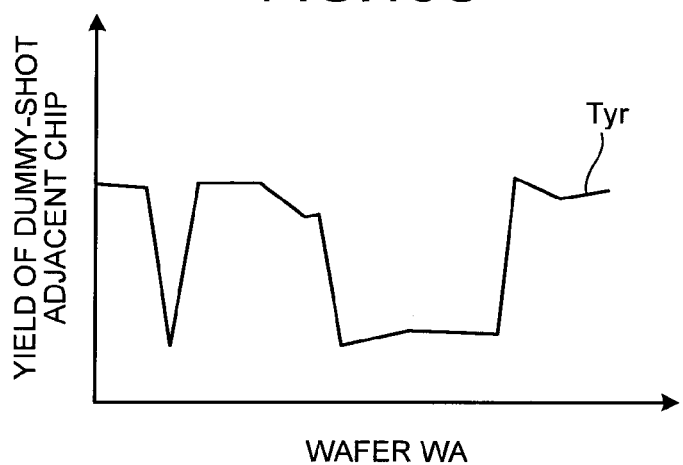

FIGS. 13A to 13C are diagrams for explaining the determination method of the exposure or non-exposure to the dummy shot based on the tendency of the focus leveling value and the yield of the dummy-shot adjacent chip. FIG. 13A illustrates a correspondence relationship between a scan position of the focus leveling value in the dummy shot Rx on the wafer WA and a leveling correction coefficient (leveling correction coefficient in a slit direction in FIG. 13A). In a graph shown in FIG. 13A, a horizontal axis indicates the scan position and a vertical axis indicates the leveling correction coefficient. On the horizontal axis, the scan position on the left side is the center side in the surface of the wafer WA and the scan position on the right side is the peripheral portion side of the wafer WA.

Correction coefficient information Tdr indicates the leveling correction coefficient when the focus leveling value only on the inner side of the dr position C is used in the conventional manner. Correction coefficient information Twee indicates the leveling correction coefficient when the focus leveling value up to the inner side of the WEE position A is used. In the correction coefficient information Tdr, the leveling correction coefficient on the outer side of the dr position C is constant. This is because the focus leveling correction is not performed on the outer side of the dr position C.

On the other hand, in the correction coefficient information Twee, the leveling correction coefficient becomes large in accordance with the position on the wafer WA even outer side of the dr position C. FIG. 13A illustrates a difference between the correction coefficient information Twee at the WEE position A (outermost periphery of the region in which the resist is not removed) and the correction coefficient information Tdr at the dr position C (outermost periphery of the region in which the focus leveling correction is performed) as a leveling difference D.

The leveling difference D indicates various values for each dummy shot Rx. The exposure/non-exposure determining unit 15 determines the exposure or non-exposure to the dummy shot Rx for each of the regions X1 to X8 of the wafer WA by using a history of the leveling correction coefficient when scanning is performed only on the inner side of the dr position C and a history of the leveling correction coefficient when scanning is performed up to the inner side of the WEE position A. Therefore, the height information calculating unit 31 calculates the leveling correction coefficient in the dummy shot Rx for each of the regions X1 to X8 of the wafer WA in advance. Then, the height information calculating unit 31 sends the calculated leveling correction coefficients to the exposure/non-exposure determining unit 15 via the input unit 11 for each of the regions X1 to X8.

FIG. 13B indicates the leveling difference D of each wafer WA as leveling difference information Td. In a graph shown in FIG. 13B, a horizontal axis indicates the wafer WA and a vertical axis indicates the leveling difference D.

FIG. 13C indicates the yield of the dummy-shot adjacent chip for each wafer WA as yield information Tyr. In a graph shown in FIG. 13C, a horizontal axis corresponds to the horizontal axis shown in FIG. 13B and a vertical axis indicates the yield of the dummy-shot adjacent chip.

Comparing the leveling difference information Td in FIG. 13B with the yield information Tyr in FIG. 13C, it is found that a correlation exists between the leveling difference D and the yield of the dummy-shot adjacent chip, and the yield of the dummy-shot adjacent chip is lowered when the leveling difference D is large.

Therefore, in the present embodiment, the exposure/non-exposure determining unit 15 calculates the correlation between the leveling difference D and the yield of the dummy-shot adjacent chip. Moreover, a management value (lower limit m and upper limit n) is set to the leveling difference information Td based on the correlation. Then, when the leveling difference information Td is out of the management value, the exposure/non-exposure determining unit 15 sets so that the dummy shot Rx corresponding to this leveling difference information Td is not exposed. In this example, a case is explained in which the lower limit m and the upper limit n are set as the management value; however, only the upper limit n can be set as the management value.

Moreover, the scan direction of the wafer WA when performing the focus leveling control is not limited to a linear direction shown in FIG. 12B. For example, the scan direction of the wafer WA when performing the focus leveling control can meander in a zigzag manner.

Figure 14:
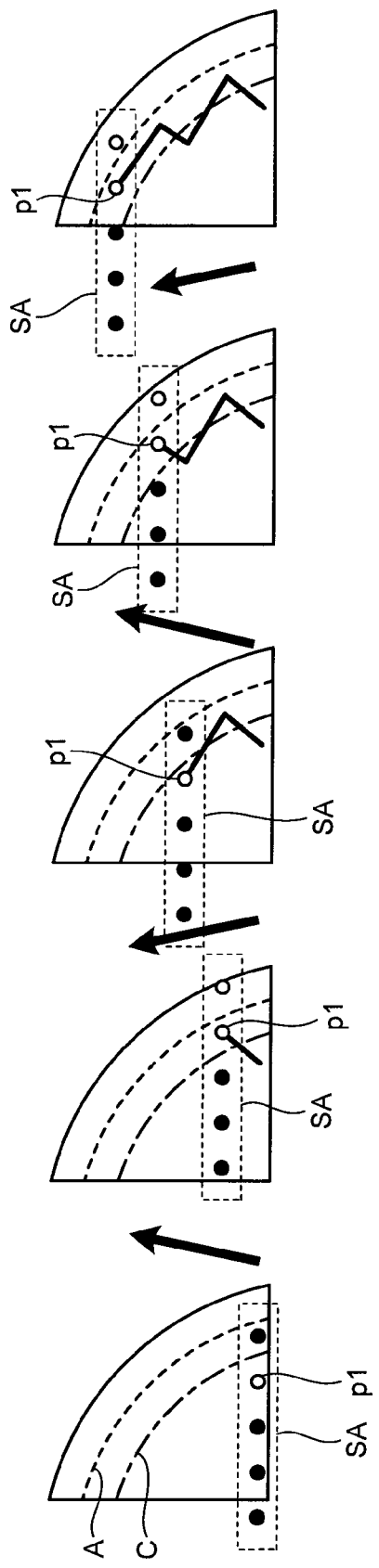
FIG. 14 is a diagram illustrating a scan position when a scan direction meanders in a zigzag manner.

FIG. 14 is a diagram illustrating the scan position when the scan direction meanders in a zigzag manner. As shown in FIG. 14, a predetermined measurement position (measurement position p1 that is the second from the right in FIG. 14) meanders in a zigzag manner among the focus leveling measurement positions (closed circles) in a scan region SA. At this time, the scan region SA is moved so that the measurement position p1 is moved alternately between a position on the inner side of the dr position C and a position that is on the outer side of the dr position C and the inner side of the WEE position A.

Specifically, a driving direction of the wafer stage 46 is controlled so that the scan direction of the wafer WA meanders in a zigzag manner in a focus mapping that is performed before the exposure of the wafer WA. Whereby, even when the region between the WEE position A and the dr position C is narrow, it is possible to set a large number of focus leveling detection points between the WEE position A and the dr position C. Therefore, the focus leveling control can be performed with high accuracy.

Figure 15:
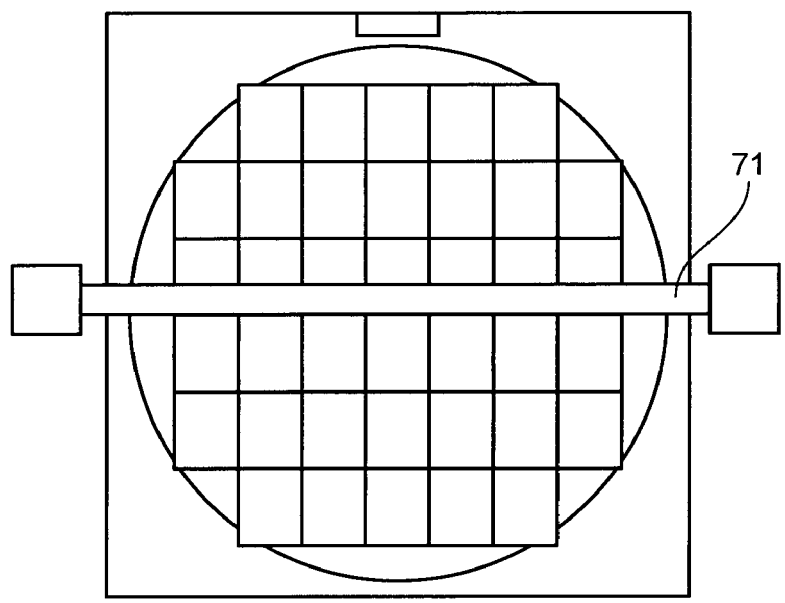
FIG. 15 is a diagram illustrating a focus sensor on a line sensor.

As shown in FIG. 15, it is applicable to obtain the wafer height information before the exposure by using a focus sensor on a line sensor 71 and determine the exposure or non-exposure to the dummy shot Rx by using the obtained wafer height information.

After the shot map generating unit 13 generates the shot map, the exposure instructing unit 14 sends the exposure instruction to the exposure mechanism 2. Specifically, the exposure instructing unit 14 sends the exposure instruction to the exposure mechanism 2 to expose the wafer WA while excluding the dummy shot Rx that is determined not to be exposed by the exposure/non-exposure determining unit 15 in the shot map generated by the shot map generating unit 13. Whereby, the exposure mechanism 2 exposes the wafer WA in accordance with the instruction from the exposure instructing unit 14 (Step S160).

The exposure mechanism 2 exposes all of the perfect shots Px and all of the effective defective shots Qx. Moreover, the exposure mechanism 2 exposes only the exposure shot that is set to be exposed by the exposure/non-exposure setting unit 12 among the dummy shots Rx and is determined to be exposed by the exposure/non-exposure determining unit 15.

Conventionally, the dummy shot in which the effective chip cannot be formed is subjected to the focus leveling control by using the focus leveling value measured on the inner side of the dr position C. Therefore, the conventional dummy shot is easily brought into a defocus state and causes a defect failure due to a pattern collapse or the like. Thus, a problem exists in that the exposure to the dummy shot lowers the yield of the dummy-shot adjacent chip.

In the present embodiment, because the focus leveling control is performed by using the focus leveling value measured on the inner side of the WEE position A, the dummy shot is not easily brought into the defocus state and it is possible to set such that the dummy shot that cannot follow the focus is not exposed. Thus, the defect failure due to a pattern collapse or the like can be prevented.

Figure 16:
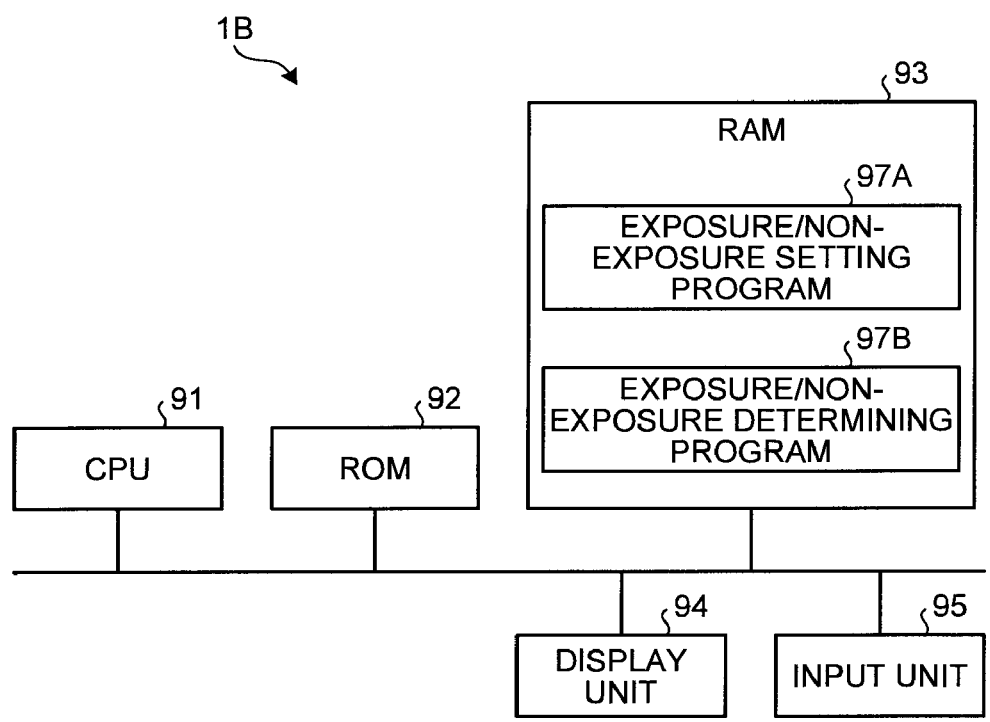
FIG. 16 is a diagram illustrating a hardware configuration of the exposure control apparatus.

Next, a hardware configuration of the exposure control apparatus 1B is explained. FIG. 16 is a diagram illustrating the hardware configuration of the exposure control apparatus. The exposure control apparatus 1B includes a CPU (Central Processing Unit) 91, a ROM (Read Only Memory) 92, a RAM (Random Access Memory) 93, a display unit 94, and an input unit 95. In the exposure control apparatus 1B, the CPU 91, the ROM 92, the RAM 93, the display unit 94, and the input unit 95 are connected via a bus line.

The CPU 91 sets the exposure or non-exposure to the dummy shot Rx by using an exposure/non-exposure setting program 97A that is a computer program, and determines whether to actually expose the dummy shot Rx that is set to be exposed by an exposure/non-exposure determining program 97B. The display unit 94 is a display device such as a liquid crystal monitor, and displays the exposure parameter, the chip information, the WEE position A, the dr position C, the edge bead removing position B, the exposure reference of the dummy shot Rx, and the like based on an instruction from the CPU 91. The input unit 95 includes a mouse and a keyboard, and inputs instruction information (such as parameter necessary for setting or determination of the exposure or non-exposure) that is externally input by a user. The instruction information input to the input unit 95 is sent to the CPU 91.

The exposure/non-exposure setting program 97A and the exposure/non-exposure determining program 97B are stored in the ROM 92 and are loaded in the RAM 93 via the bus line. FIG. 16 illustrates a state where the exposure/non-exposure setting program 97A and the exposure/non-exposure determining program 97B are loaded in the RAM 93.

The CPU 91 executes the exposure/non-exposure setting program 97A and the exposure/non-exposure determining program 97B loaded in the RAM 93. Specifically, in the exposure control apparatus 1B, the CPU 91 reads out the exposure/non-exposure setting program 97A and the exposure/non-exposure determining program 97B from the ROM 92, loads them in a program storage area in the RAM 93, and executes various processes, in accordance with the input of an instruction by a user from the input unit 95. The CPU 91 temporarily stores various data generated in the various processes in the data storage area formed in the RAM 93.

The exposure/non-exposure setting program 97A and the exposure/non-exposure determining program 97B executed in the exposure control apparatus 1B have module configurations including the exposure/non-exposure setting unit 12 and the exposure/non-exposure determining unit 15, respectively. The exposure/non-exposure setting unit 12 and the exposure/non-exposure determining unit 15 are loaded in a main storage device, so that the exposure/non-exposure setting unit 12 and the exposure/non-exposure determining unit 15 are generated on the main storage device. The exposure control apparatus 1B includes a shot map generating program (not shown) that generates the shot map, and the shot map generating program generates the shot map.

The exposure control apparatus 1A explained in the first embodiment has a hardware configuration similar to the exposure control apparatus 1B. The exposure control apparatus 1A explained in the first embodiment includes the exposure/non-exposure setting program 97A and the shot map generating program that are computer programs. The exposure control apparatus 1A sets the exposure or non-exposure by using the exposure/non-exposure setting program 97A and the shot map generating program and generates the shot map.

In this manner, in the present embodiment, the leveling difference D is calculated by using the correction coefficient information Twee and the correction coefficient information Tdr, and the exposure or non-exposure to the dummy shot Rx is determined based on the correlation between the leveling difference D and the yield of the dummy-shot adjacent chip. Therefore, it is appropriately and easily determined whether to expose the dummy shot Rx in which the defocusing is easy to occur based on the yield of the dummy-shot adjacent chip.

It is applicable to calculate the tendency of the focus leveling value by a different apparatus other than the exposure control apparatus 1B. In this case, the exposure/non-exposure determining unit 15 determines whether to actually expose the dummy shot Rx by using the tendency of the focus leveling value calculated by the different apparatus.

Moreover, in the present embodiment, the exposure or non-exposure to the dummy shot Rx is determined based on the correlation between the leveling difference D and the yield of the dummy-shot adjacent chip; however, the exposure or non-exposure to the dummy shot Rx can be determined based on other information. For example, the exposure or non-exposure to the dummy shot Rx can be determined by any method so long as the method uses the wafer height information obtained on the inner side of the dr position C and the wafer height information obtained on the inner side of the WEE position A.

Furthermore, in the present embodiment, the exposure/non-exposure determining unit 15 determines the exposure or non-exposure to the dummy shot Rx; however, the exposure/non-exposure setting unit 12 can determine the exposure or non-exposure to the dummy shot Rx. In this case, it is sufficient that the exposure/non-exposure setting unit 12 has a function of the exposure/non-exposure determining unit 15.

The exposure/non-exposure determining unit 15 can apply the determination of the exposure or non-exposure to the dummy shot Rx to the effective defective shot Qx. In this case, the exposure/non-exposure determining unit 15 determines the exposure or non-exposure to the effective defective shot Qx based on the focus leveling value on the inner side of the WEE position A in the effective defective shot Qx.

In this manner, according to the second embodiment, it is possible to appropriately and easily determine whether to expose the dummy shot Rx in which the defocusing is easy to occur based on the yield of the dummy-shot adjacent chip. Whereby, it is possible to avoid the exposure to the dummy shot Rx that lowers the yield of the dummy-shot adjacent chip. Thus, the dummy-shot adjacent chip can be formed with high yield and the wafer WA as a whole can be exposed with high throughput.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the sprit of the inventions. The accompanying claims and their equivalents are intended to cover such forms or modifications as would fall within the scope and spirit of the inventions.

What is claimed is:

1. An exposure control apparatus comprising:
    an exposure setting unit that performs an exposure setting of setting an exposure shot as a shot that is exposed or a shot that is not exposed based on height information on a height of a substrate in the exposure shot arranged in a substrate peripheral portion; and
    an exposure instructing unit that outputs an exposure instruction to the shot that is exposed and an instruction to skip an exposure to the shot that is not exposed.

2. The exposure control apparatus according to claim 1, wherein the exposure setting unit performs the exposure setting based on a resist removing region width that is a dimension of a resist removing region, in which a resist is removed from an upper surface side of the substrate close to an edge portion of the substrate, from the edge portion, a chip size in the exposure shot, and a chip layout in the exposure shot.

3. The exposure control apparatus according to claim 2, wherein the exposure setting unit performs the exposure setting based on an area occupying an inner side of the resist removing region in the exposure shot.

4. The exposure control apparatus according to claim 2, wherein the exposure setting unit performs the exposure setting based on an area ratio of an area occupying an inner side of the resist removing region in the exposure shot to an area of the exposure shot or a product chip area in the exposure shot.

5. The exposure control apparatus according to claim 2, wherein the exposure setting unit performs the exposure setting by using a difference between a first focus leveling value as the height information measured on an inner side of the resist removing region and a second focus leveling value as the height information measured inside a region in which a focus leveling control of the substrate is performed.

6. The exposure control apparatus according to claim 5, wherein
the first focus leveling value is a focus leveling value that is measured at an outermost periphery of a region in which the resist is not removed, and
the second focus leveling value is a focus leveling value that is measured at an outermost periphery of the region in which the focus leveling control of the substrate is performed.

7. The exposure control apparatus according to claim 5, wherein the exposure setting unit calculates a correlation between a failure rate of an effective product chip adjacent to a dummy shot that is the exposure shot in which no effective product chip is formed among the exposure shots and the difference, and performs the exposure setting based on a calculation result.

8. The exposure control apparatus according to claim 5, wherein the first focus leveling value and the second focus leveling value are measured while moving a measurement position of the substrate alternately between a region on an inner side of the resist removing region and the region in which the focus leveling control of the substrate is performed, when measuring the height information on the substrate.

9. The exposure control apparatus according to claim 1, wherein the exposure setting unit performs the exposure setting on a dummy shot that is the exposure shot in which no effective product chip is formed among the exposure shots.

10. The exposure control apparatus according to claim 9, wherein the exposure setting unit performs the exposure setting based on a failure rate of the effective product chip adjacent to the dummy shot.

11. The exposure control apparatus according to claim 10, wherein the exposure setting unit performs the exposure setting based on the failure rate induced for each process completion degree of the substrate.

12. The exposure control apparatus according to claim 1, wherein the exposure setting unit performs the exposure setting based on a dimension of a resist removing region, in which a resist is removed from a back surface side of the substrate toward an upper surface side thereof close to an edge portion of the substrate, from the edge portion, a chip size in the exposure shot, and a chip layout in the exposure shot.

13. The exposure control apparatus according to claim 1, wherein the exposure setting unit performs the exposure setting based on a dimension from a boundary position of a region in which a focus leveling correction is performed close to an edge portion of the substrate and a region in which the focus leveling correction is not performed to the edge portion, a chip size in the exposure shot, and a chip layout in the exposure shot.

14. A manufacturing method of a semiconductor device, comprising: with an exposure control apparatus according to claim 1,
performing exposure and development on a semiconductor substrate above which a resist is formed based on an instruction from the exposure control apparatus;
forming a resist pattern above the semiconductor substrate; and
processing a process target of the semiconductor substrate with the resist pattern as a mask to manufacture the semiconductor device.

15. An exposure apparatus comprising:
an exposure setting unit that performs an exposure setting of setting an exposure shot as a shot that is exposed or a shot that is not exposed based on height information on a height of a substrate in the exposure shot arranged in a substrate peripheral portion;
an exposure instructing unit that outputs an exposure instruction to the shot that is exposed and an instruction to skip an exposure to the shot that is not exposed; and
an exposing unit that performs an exposure process on the shot that is exposed based on the instruction output from the exposure instruction unit.

16. The exposure apparatus according to claim 15, further comprising a height information calculating unit that calculates the height information for each substrate, wherein
the exposure setting unit performs the exposure setting based on the height information calculated by the height information calculating unit.

17. The exposure apparatus according to claim 16, wherein the height information calculating unit calculates a first focus leveling value as the height information on an inner side of a resist removing region in which a resist is removed from an upper surface side of the substrate close to an edge portion of the substrate and calculates a second focus leveling value as the height information inside a region in which a focus leveling control of the substrate is performed, and
the exposure setting unit performs the exposure setting by using a difference between the first focus leveling value and the second focus leveling value.

18. The exposure apparatus according to claim 17, wherein the height information calculating unit calculates the first focus leveling value at an outermost periphery of a region in which the resist is not removed and calculates the second focus leveling value at an outermost periphery of the region in which the focus leveling control of the substrate is performed.

19. The exposure apparatus according to claim 17, wherein the height information calculating unit calculates the first focus leveling value and the second focus leveling value by using a signal that is detected while moving a measurement position of the substrate alternately between a region on an inner side of the resist removing region and the region in which the focus leveling control of the substrate is performed.

20. The exposure apparatus according to claim 15, wherein the exposure setting unit performs the exposure setting based on a resist removing region width that is a dimension of a resist removing region, in which a resist is removed from an upper surface side of the substrate close to an edge portion of the substrate, from the edge portion, a chip size in the exposure shot, and a chip layout in the exposure shot.

* * * * *